(12) United States Patent
Lewis

(10) Patent No.: US 10,416,204 B2
(45) Date of Patent: Sep. 17, 2019

(54) DEVICE FOR MEASURING VOLTAGE ACROSS A REMOTE LOAD

(71) Applicant: Hanchett Entry Systems, Inc., Phoenix, AZ (US)

(72) Inventor: Robert W. Lewis, Tempe, AZ (US)

(73) Assignee: Hanchett Entry Systems, Inc., Phoenix, AZ (US)

( * ) Notice: Subject to any disclaimer, the term of this patent is extended or adjusted under 35 U.S.C. 154(b) by 0 days.

(21) Appl. No.: 16/256,505

(22) Filed: Jan. 24, 2019

(65) Prior Publication Data

US 2019/0154740 A1 May 23, 2019

Related U.S. Application Data

(63) Continuation of application No. 15/184,024, filed on Jun. 16, 2016, now Pat. No. 10,191,093.

(60) Provisional application No. 62/186,692, filed on Jun. 30, 2015.

(51) Int. Cl.
*G01R 19/00* (2006.01)
*G01R 19/25* (2006.01)
*G01R 15/14* (2006.01)
*G01R 21/06* (2006.01)

(52) U.S. Cl.
CPC ...... *G01R 19/2513* (2013.01); *G01R 19/0084* (2013.01); *G01R 19/2503* (2013.01); *G01R 15/144* (2013.01); *G01R 19/0092* (2013.01); *G01R 21/06* (2013.01)

(58) Field of Classification Search
CPC ............... G01R 19/00; G01R 19/0084; G01R 19/0092; G01R 19/25; G01R 19/2503; G01R 19/2513; G01R 19/257; G01R 15/00; G01R 15/12; G01R 15/144; G01R 17/00; G01R 21/00; G01R 21/06; G01R 21/08; G01R 27/00; G01R 27/08; G01R 31/00; G01R 31/08
USPC ...... 324/600, 609, 649, 658, 691, 713, 72.5, 324/76.11, 76.39, 98, 177, 522
See application file for complete search history.

(56) References Cited

U.S. PATENT DOCUMENTS

| | | | |
|---|---|---|---|
| 4,523,248 A | 6/1985 | Schmale et al. | |
| 5,793,191 A | 8/1998 | Elmore et al. | |
| 8,305,043 B2 | 11/2012 | Yamamoto et al. | |
| 8,754,622 B2 | 6/2014 | Dobkin et al. | |
| 9,570,978 B2 * | 2/2017 | Matsumoto | H02M 1/08 |
| 2004/0008014 A1 | 1/2004 | Engelhardt et al. | |

(Continued)

*Primary Examiner* — Hoai-An D. Nguyen
(74) *Attorney, Agent, or Firm* — Ronald J. Kisicki, Esq.; Woods Oviatt Gilman LLP

(57) ABSTRACT

A device for measuring voltage across a remote load includes a power supply configured to output a first output voltage to the remote load. A switch is selectively movable from a closed position to an open position. A measuring circuit measures a load voltage across the load when the switch is in the open position and determines a voltage difference between the first output voltage and the load voltage. The measuring circuit adjusts the first output voltage to a second output voltage to compensate for the voltage difference. A second A/D converter can also be coupled to the power supply. The second A/D converter measures a voltage across a resistor such that a change in the voltage indicates a change in the load voltage. The power supply is then adjusted to output a second output voltage to compensate for any change in load voltage.

9 Claims, 2 Drawing Sheets

(56) References Cited

U.S. PATENT DOCUMENTS

| | | |
|---|---|---|
| 2004/0119460 A1 | 6/2004 | Benes et al. |
| 2005/0018457 A1 | 1/2005 | Iwashita |
| 2009/0261805 A1 | 10/2009 | Shuey |
| 2010/0073835 A1 | 3/2010 | Jung |
| 2011/0181268 A1 | 7/2011 | Shuey |
| 2013/0342177 A1* | 12/2013 | Slattery .................... G05F 1/46 323/234 |
| 2015/0309545 A1 | 10/2015 | Shuey |
| 2016/0094134 A1 | 3/2016 | Iyasu et al. |
| 2016/0187393 A1 | 6/2016 | Ramirez |
| 2017/0187285 A1 | 6/2017 | Kim et al. |
| 2018/0100881 A1 | 4/2018 | Liu |

\* cited by examiner

DEVICE FOR MEASURING VOLTAGE ACROSS A REMOTE LOAD

CROSS-REFERENCE TO RELATED APPLICATIONS

This application is a continuation of U.S. patent application Ser. No. 15/184,024, filed on Jun. 16, 2016, now U.S. Pat. No. 10,191,093, which claims the benefit of U.S. Patent Application No. 62/186,692, filed on Jun. 30, 2015, the contents of each are hereby incorporated by reference in their entirety.

TECHNICAL FIELD

The present invention relates to measuring voltage across a remote load; more particularly, to measuring voltage using remote sensing of the voltage supplied to the remote load by a power supply; and most particularly, to a device for measuring and adjusting the voltage supplied to the remote load from the power supply without requiring dedicated remote sense wires.

BACKGROUND OF THE INVENTION

FIG. 1 shows a prior art power circuit 10 configured for remote sensing of a load voltage. Circuit 10 generally includes a power supply 12 configured to output a voltage to a load 14 via wires 16, 18. The power supply is regulated so as to output a stable output voltage, for instance 24 VDC. However, wires 16 and 18 inherently possess a certain resistance when current flows through the wires. By way of example, standard 24 gauge wire has a resistance of 2.567 ohms per 100 feet. This resistance causes a drop in voltage between the power supply and the load. Thus, if wires 16 and 18 are long, they may cause a significant voltage drop over the length of the run. To continue the above example, if wires 16 and 18 are 24 gauge wire having lengths of 350 feet, each wire would have a resistance of about 9 ohms equating to a total wire resistance of 18 ohms. If the load current is 220 mA, the calculated voltage drop across the load would be about 4 V ($V_{drop}$=0.220 A*18 ohms). Thus, the load only receives 20 volts from the power supply. If the load requires 24 V for proper operation, the output voltage will need to be adjusted upwards about 4 V so as to output about 28 V to account for the voltage drop of the wires so that the required 24 V load voltage may be supplied to the load.

As shown in FIG. 1, prior art power supplies employ a pair of sense wires 20, 22 to provide remote sensing of the load voltage. Sense wires 20, 22 are selected so as to require minimal current and therefore result in low voltage drop across the sense wires. Sense wires 20, 22 operate to create a voltage feedback so that the power supply can adjust the output voltage until the sense wires sense the proper load voltage being supplied to the remote load. Sense wires 20, 22 may be shielded 26. While providing the necessary voltage regulation of the power supply to produce the required load voltage, sense wires 20, 22 increase the cost and complexity of the circuit by requiring additional wires to be run and the provision of dedicated sense wire terminals at the power supply.

What is needed in the art is a device that remotely senses the output voltage being supplied to a load without requiring the use of dedicated remote sensing wires. This device may be of particular advantage over long wire runs as the elimination of the dedicated remote sensing wires saves costs associated with this additional material and also simplifies installation by eliminating the need to properly wire the remote sensing wires to the remote sense terminals on the power supply. Moreover, in the case of a retrofit installation there may only be one pair of wires run between the power supply and the load.

It is a principal object of the present invention to provide a device for measuring voltage across a remote load wherein a switch such as, for example, a mechanical switch or a relay, transistor, MOSFET, or other solid state device, is integrated within the power supply circuit such that, when the switch is closed the device measures the output voltage of the power supply and, when the switch is opened the device measures the output voltage across a capacitor connected in parallel with the load. These two measurements are used to determine the voltage drop between the power supply and load such that the power output voltage supplied by the power supply may be increased so as to provide the desired load voltage at the load. The device may also include a second voltage sensor which is configured to allow for quick changes to the output voltage at the power supply to accommodate for load changes when the switch is in the closed position.

SUMMARY OF THE INVENTION

Briefly described, a device for measuring voltage across a remote load comprises a power supply configured to output a first output voltage to the remote load. A switch is located between the power supply and the load and is selectively movable from a closed position to an open position. A measuring circuit is configured to measure a load voltage across the load when the switch is in the open position so as to determine a voltage difference between the first output voltage and the load voltage. The measuring circuit may be further configured to adjust the first output voltage to a second output voltage to compensate for the voltage difference.

In accordance with an aspect of the present invention, the measuring circuit comprises a first analog to digital (A/D) converter coupled to the power supply and a load capacitor connected in parallel with the load. The load capacitor may supply the load current to the load when the switch is in the open position and the first A/D converter measures the load voltage supplied from the load capacitor. The measuring circuit may further comprise a second A/D converter coupled to the power supply. The second A/D converter is configured to measure a voltage across a resistor wherein the voltage indicates changes in the load current and voltage. The power supply is then adjusted to output a second output voltage to compensate for the change in load voltage. The circuit may include a proportional-integral-derivative (PID) controller configured to adjust the power supply to output the correct load voltage in real time.

In accordance with a further aspect of the present invention, a method for measuring voltage across a remote load is provided. The method comprises a) providing a power supply configured to output a first output voltage to the remote load; b) locating a switch selectively movable from a closed position to an open position between the power supply and the load; c) providing a measuring circuit configured to measure a load voltage across the load when the switch is in the open position; d) allowing the switch to be moved to the open position; e) measuring the load voltage; and f) determining a voltage difference between the first output voltage and the load voltage.

In accordance with another aspect of the invention, the method may further include (g) allowing the power supply to adjust the first output voltage to output a second output voltage to compensate for the voltage difference.

In accordance with yet another aspect of the invention, the method may further include (g) allowing a second A/D converter to measure a voltage across the sense resistor wherein a change in the voltage indicates a change in the load current and voltage; and (h) allowing a control signal to be sent to the power supply to adjust the power supply to output a second output voltage to compensate for the change in load voltage.

In accordance with a further aspect of the invention, a device for measuring voltage across a remote load comprises a power supply coupled to the remote load by a pair of wires. The power supply comprises a power output module configured to output a first output voltage to the remote load. A receiver is configured to receive voltage information from the remote load and a first switch unit is configured to selectively couple respective first ends of the pair of wires to either the power output module or the receiver. The device further comprises a measuring circuit coupled to the load and configured to measure a load voltage across the load. The measuring circuit comprises a load capacitor connected in parallel with the load. The load capacitor supplies the load current to the load when the first switch is selected to couple the respective first ends of the pair of wires to the receiver. A first A/D converter is configured to measure the load voltage supplied by the load capacitor and packet the measured load voltage into the voltage information. A transmitter is in communication with the first A/D converter and is configured to receive the voltage information from the first A/D converter and transmit the voltage information to the receiver. A second switch unit is configured to selectively couple respective second ends of the pair of wires to either the load or the receiver. When the first switch unit couples the respective first ends of the pair of wires to the power output module, the second switch unit is selected to couple the respective second ends of the pair of wires to the load. When the first switch unit is selected to couple the respective first ends of the pair of wires to the receiver, the second switch unit is selected to couple the respective second ends of the pair of wires to the transmitter by detection of voltage or current interruption.

In accordance with another aspect of the present invention, the pair of wires is configured to operate as a differential pair, such as to minimize noise when the transmitter transmits the voltage information to the receiver.

In accordance with the present invention, the first A/D converter, the transmitter or the receiver may be configured to calculate a voltage difference between the first outlet voltage and the load voltage packeted within the voltage information. The receiver may further configured to output an adjustment signal to the power supply to cause the power supply to output a second output voltage to compensate for the voltage difference.

In accordance with a further aspect of the present invention, the measuring circuit comprises a second A/D converter and a sense resistor coupled to the power supply. The second A/D converter is configured to measure a voltage across the sense resistor wherein a change in the voltage indicates a change in the load voltage. The power supply may then be adjusted to output a second output voltage to compensate for the change in load voltage.

In accordance with yet a further aspect of the present invention, a method for measuring voltage across a remote load comprises: a) providing a power supply coupled to the remote load by a pair of wires, the power supply including a power control module configured to output a first output voltage to the remote load, receiver and a first switch unit, and a measuring circuit coupled to the load and configured to measure a load voltage across the load, the measuring circuit including a load capacitor connected in parallel with the load, a first A/D converter, a transmitter in communication with the first A/D converter and a second switch unit; b) toggling the first switch unit to couple respective first ends of the pair of wires to the power control module and toggling the second switch unit to couple respective second ends of the pair of wires to the remote load whereby the power supply module supplies the first output voltage to the remote load; c) toggling the first switch unit to couple the respective first ends of the pair of wires to the receiver whereby the second switch unit toggles to couple the respective second ends of the pair of wires to the transmitter; d) allowing the load capacitor to provide the load current to the remote load; e) configuring the first A/D converter to measure the load voltage being supplied to the remote load by the load capacitor; f) packeting the measured load voltage into a voltage information packet; g) communicating the voltage information packet to the transmitter; and h) transmitting the voltage information packet to the receiver.

In still a further aspect of the present invention, the method may further include i) configuring the receiver to output an adjustment signal to the power output module to adjust the power output module to output a second output voltage to compensate for the voltage difference, wherein the first A/D converter, the transmitter or the receiver is configured to calculate a voltage difference between the first output voltage and the load voltage packeted within the voltage information packet.

In a further aspect of the present invention, the measuring circuit may further comprise a second A/D converter and a sense resister coupled to the power supply, wherein the method may further include i) configuring the second A/D converter to measure a voltage across the sense resistor wherein the voltage indicates a change in the load current and voltage; and j) adjusting the power output module to output a second output voltage to compensate for the change in load voltage.

Numerous applications, some of which are exemplarily described below, may be implemented using the present invention.

BRIEF DESCRIPTION OF THE DRAWINGS

The present invention will now be described, by way of example, with reference to the accompanying drawings, in which.

Figure 1:
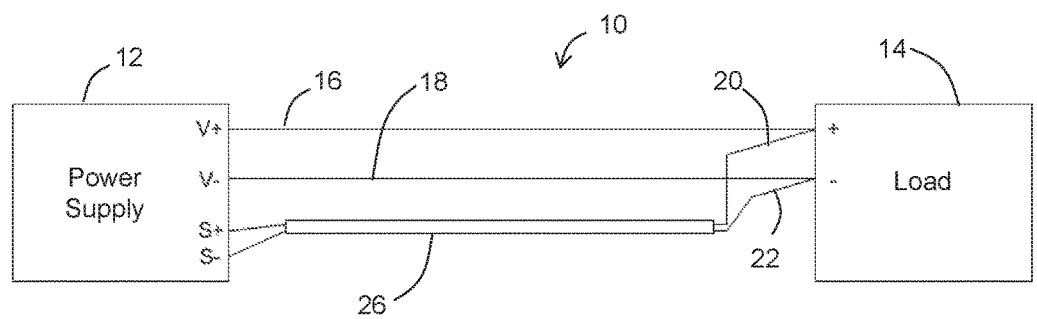
FIG. 1 is a schematic diagram of a remote sense circuit utilizing dedicated remote sensing wires, as is known in the art.

Corresponding reference characters indicate corresponding parts throughout the several views. The exemplifications set out herein illustrate currently preferred embodiments of the present invention, and such exemplifications are not to be construed as limiting the scope of the invention in any manner.

DESCRIPTION OF THE PREFERRED EMBODIMENTS

Figure 2:
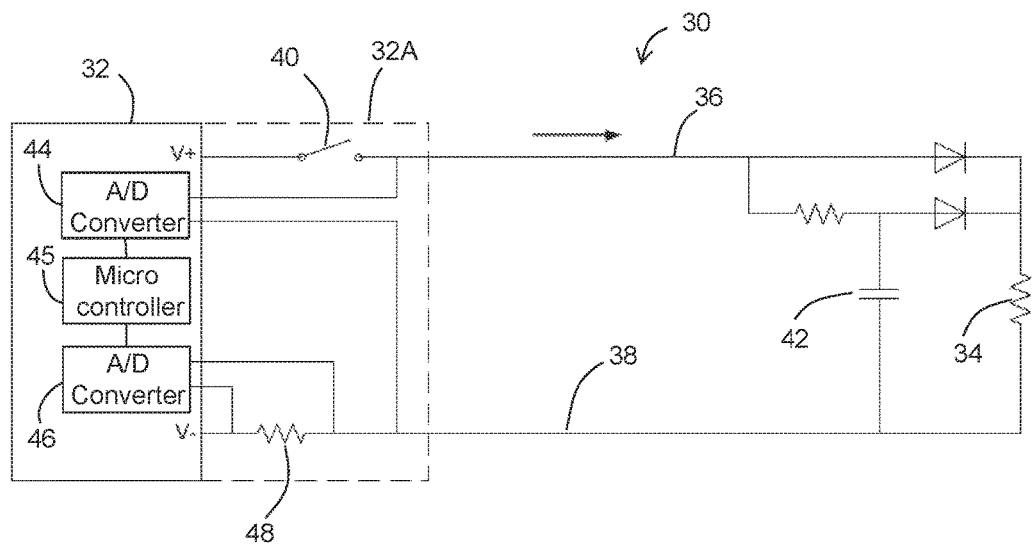
FIG. 2 is a schematic diagram of a device for measuring voltage across a remote load, in accordance with an embodiment of the present invention.

Referring now to FIG. 2, a first embodiment of a device for measuring voltage across a remote load in accordance with the present invention is generally indicated by reference numeral 30. Device 30 includes a power supply 32 coupled to a load 34 (as represented by a resistor) by a pair of wires 36, 38. Switch 40 is connected to power supply 32 via wire 36 and is selectively movable between a closed position and an open position (as shown). In a further aspect of the present invention, switch 40 may be housed within the power supply, as indicated by dashed line 32A. When the switch 40 is in the closed position, an output voltage supplied by power supply 32 powers the load 34. Power supply 32 further charges the capacitor 42, which is connected in parallel with the load 34. In this manner, as switch 40 is moved to its open position, capacitor 42 is able to provide the required power to power load 34.

Device 30 is configured to include a voltage measuring circuit to measure voltage across load 34. To that end, power supply 32 includes a A/D converter 44 wherein, when switch 40 is in the open position, A/D converter 44 measures the load voltage across the load as supplied by capacitor 42. As wires 36 and 38 possess resistance, output voltage supplied by the power supply will be subject to voltage drop at the load. A/D converter 44 measures this voltage drop by measuring the load voltage. The load voltage is then compared to the nominal output voltage, measured by A/D convertor 44 with switch 40 closed, being supplied by power supply 32 to determine the voltage drop (i.e., output voltage minus load voltage). The output voltage can then be adjusted to compensate for the voltage drop such that power supply 32 provides an adjusted output voltage (with switch 40 in the closed position) so as to output a voltage which results in the proper voltage required for powering load 34.

In a further aspect of the present invention, power supply 32 may further include a second A/D converter 46 configured to measure voltage across a sense resistor 48, positioned on wire 38 proximate power supply 32. A/D converter 46 and A/D converter 44 may further incorporate a proportional-integral-derivative (PID) controller wherein sense resistor 48 and A/D converter 46 operate to measure the current draw of load 34 and A/D converter 44 to monitor voltage. Fluctuations in the voltage of the power supply and current draw of load 34 are detected and analyzed by the PID of A/D converter 46 and 44 such that a microcontroller 45, which may be part of power supply 32 or not, may quickly adjust the output voltage of power supply 32 to compensate for the detected change in current draw at the load. In this manner, the proper load voltage may be maintained as required by the load when switch 40 is in the closed position. As such, switch 40 need only be opened periodically to measure the load voltage and confirm that power supply 32 is outputting the proper output voltage to provide the proper load voltage at load 34.

In accordance with an aspect of the present invention, a method for measuring voltage across a remote load comprises: a) providing a power supply, such as power supply 32, configured to output a first output voltage to the remote load (i.e., load 34); b) locating a switch (such as switch 40) between the power supply and the load, the switch being selectively movable from a closed position to an open position; c) providing a measuring circuit configured to measure a load voltage across the load when the switch is in the open position; d) allowing the switch to be moved to the open position; e) allowing for the measuring of the load voltage; and f) allowing for a determination of a voltage difference between the first output voltage and the load voltage. The method may further include g) allowing the power supply to adjust the first output voltage to output a second output voltage to compensate for the voltage difference.

In a further aspect of the method, the measuring circuit may comprise a load capacitor (such as load capacitor 42) connected in parallel with the load wherein the load voltage is supplied to the load by the load capacitor after the switch has been moved to the open position. The measuring circuit may further comprise a first A/D converter (such as A/D converter 44) coupled to the power supply wherein the first A/D converter performs step e), i.e., measuring of the load voltage.

Still further, the measuring circuit may further comprise a sense resistor (such as resistor 48) and a second A/D converter (such as A/D converter 46) coupled to the power supply. In this manner, in furtherance to step f) above, the method may further include: g) allowing the second A/D converter to measure a down line voltage across the sense resistor wherein a change in the voltage indicates a change in the load current and voltage; and h) allowing a control signal to be sent to the power supply to adjusted the power supply to output a second output voltage to compensate for the change in load voltage.

Figure 3:
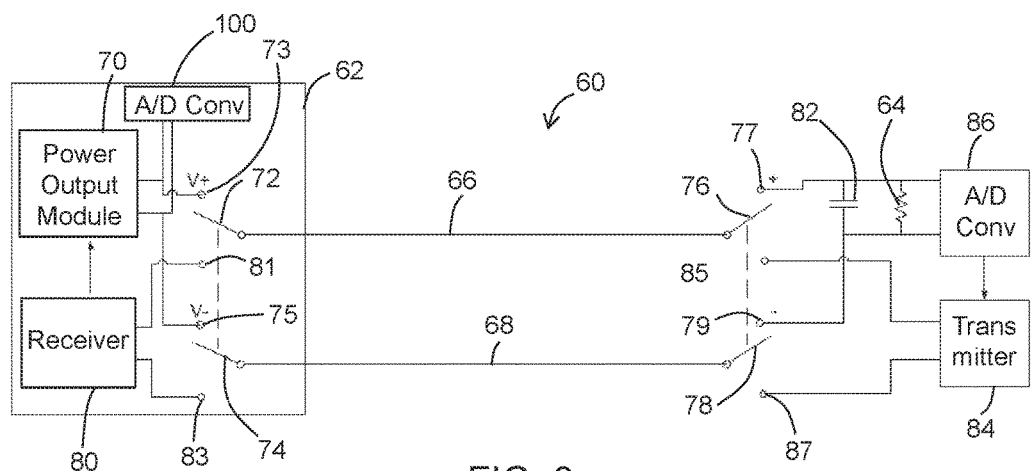
FIG. 3 is a schematic diagram of a device for measuring voltage across a remote load, in accordance with an additional embodiment of the present invention.

Turning now to FIG. 3, an alternative embodiment of a device for measuring voltage across a remote load in accordance with the present invention is generally indicated by reference numeral 60. Device 60 generally includes a power supply 62 coupled to a remote load 64 (as generally embodied as a resistor) via a pair of wires 66, 68. Power supply 62 includes a power output module 70 which is configured to provide an output voltage to remote load 64. Each respective output lead 73, 75 on power output module 70 is connected to the first end of each of wires 66 and 68 by a respective switch 72, 74 while each respective lead 77, 79 of load 64 is connected to the opposing second ends of wires 66, 68 via a respective switch 76, 78.

To measure voltage drop, switches 72 and 74 are toggled so as to contact respective leads 81, 83 on receiver 80, which may reside within power supply 62. Toggling switches 72 and 74 interrupts the power being supplied to load 64 by power output module 70. Load 64 remains powered via charge stored within capacitor 82. A/D converter 86 also detects the interruption in the power supplied by power output module 70 and causes switches 76 and 78 to toggle to contact respective leads 85, 87 on transmitter 84. The voltage across capacitor 82 is indicative of the load voltage which is measured by an A/D converter 86. The power supply voltage is measured by A/D convertor 100. The load voltage (or measured voltage drop) is then reported to transmitter 84, which communicates the load voltage (voltage drop) to receiver 80 at power supply 62. It should be noted that any of A/D converter 86, transmitter 84, or receiver 80 may be configured to calculate the voltage drop between the output voltage supplied by power output module 70 and the load voltage at load 64 (i.e., the voltage drop being equal to the output voltage minus the load voltage).

Once the voltage drop has been measured, receiver 80 may then provide a control signal to power output module 70, so as to adjust the output voltage to compensate for the voltage drop (i.e., the difference between the original output voltage and the load voltage). In this manner, power supply 62 may output the proper voltage required by the load 64 while taking into consideration the resistance of wires 66 and 68 and the voltage drop resulting therefrom. In an aspect of the present invention, wires 66 and 68 are configured to operate as a differential pair so as to minimize any noise effects which may be encountered along the run of the wires.

Figure 4:
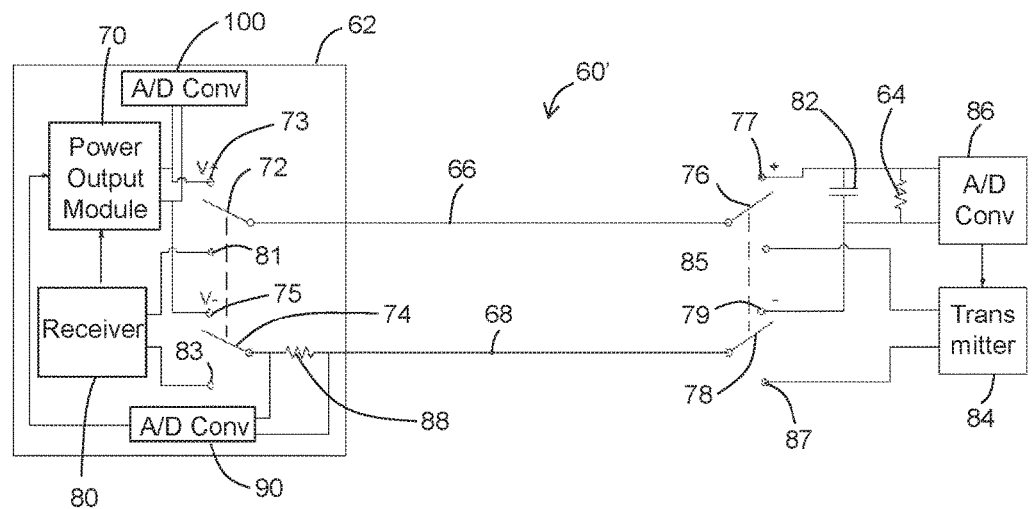
FIG. 4 is a schematic diagram of a further aspect of the device for measuring voltage across a remote load shown in FIG. 3.

In a further aspect of the present invention, as shown in FIG. 4, device 60' may further include a sense resistor 88 and A/D converter 90 similar to sense resistor 48 and A/D converter 46 discussed above with regard to embodiment 30 as shown in FIG. 2. A/D converter 90 may monitor voltage across sense resistor 88 such that any change in the current draw of the load is recognized by the A/D converter 90. With the respective switches 72, 74 and 76, 78 toggled so that power supplied by power output module 70 powers load 64, A/D converter 90 may provide a control signal to power output module 70 to adjust the output voltage to compensate for the changes in current at the load as monitored by sense resister 88. In this manner, switches 72/74 and 76/78 need only be periodically toggled to either the receiver 80 or the transmitter 84 to measure the load voltage and confirm that power output module 70 is outputting the proper output voltage, so as to provide the proper load voltage at load 64 after compensating for any voltage drop due to the resistance within wires 66 and 68. Switches 76/78 are toggled when a detection of voltage or current interruption.

In accordance with a further aspect of the present invention, a method for measuring voltage across a remote load comprises: a) providing a power supply (such as power supply 62) coupled to the remote load (such as load 64) by a pair of wires, the power supply including a power control module (such as module 70) configured to output a first output voltage to the remote load, a receiver (such as receiver 80) and a first switch unit (such as unit 72/74), and a measuring circuit coupled to the load and configured to measure a load voltage across the load, the measuring circuit including a load capacitor (such as load capacitor 82) connected in parallel with the load, a first A/D converter (such as A/D converter 86) down line from the load, a transmitter (such as transmitter 84) in communication with the first A/D converter and a second switch unit (such as unit 76/78); b) toggling the first switch unit 72/74 to couple respective first ends of the pair of wires to the power control module 70 and toggling the second switch unit 76/78 to couple respective second ends of the pair of wires to the remote load 64 whereby the power supply module supplies the first output voltage to the remote load; c) toggling the first switch unit 72/74 to couple the respective first ends of the pair of wires to the receiver 80 whereby the second switch unit 76/78 toggles to couple the respective second ends of the pair of wires to the transmitter 84; d) allowing the load capacitor 82 to provide the load voltage to the remote load; e) configuring the first A/D converter 86 to measure the load voltage being supplied to the remote load by the load capacitor; f) packeting the measured load voltage into a voltage information packet; g) communicating the voltage information packet to the transmitter; and h) transmitting the voltage information packet to the receiver.

The above method may further include i) configuring the receiver 80 to output an adjustment signal to the power output module 70 to adjust the power output module to output a second output voltage to compensate for the voltage difference, wherein the first A/D converter, the transmitter or the receiver is configured to calculate a voltage difference between the first output voltage and the load voltage packeted within the voltage information packet. Additionally and/or alternatively, the measuring circuit may further comprise a second A/D converter and a sense resistor coupled to the power supply wherein the method may include i) configuring the second A/D converter (such as A/D converter 90) to measure a voltage across a sense resistor (such as resistor 88) wherein the voltage indicates a change in the load voltage; and j) adjusting the power output module to output a second output voltage to compensate for the change in load voltage. It is understood that when an element is referred to as being "on", "connected to/with", or "coupled to/with" another element, the element can be directly on, connected to/with or coupled to/with the other element or intervening elements may also be present.

While the invention has been described by reference to various specific embodiments, it should be understood that numerous changes may be made within the spirit and scope of the inventive concepts described. Accordingly, it is intended that the invention not be limited to the described embodiments, but will have full scope defined by the language of the following claims.

What is claimed is:

1. A device for measuring a voltage across a remote load, comprising:
  a) a power supply configured to output a first output voltage to said remote load;
  b) a switch located between said power supply and said remote load, wherein said switch is selectively movable from a closed position to an open position;
  c) a measuring circuit comprising:
    i) a first analog to digital (A/D) converter; and
    ii) a capacitor connected to said remote load and chargeable by said power supply when said switch is in said closed position,
  wherein said capacitor supplies a capacitor voltage to said remote load when said switch is in said open position, wherein said measuring circuit is configured to measure said first output voltage when said switch is in said closed position and to measure said capacitor voltage when said switch is in said open position, and wherein said voltage across said remote load is determined by said measuring circuit based upon said measured first output voltage and said measured capacitor voltage.

2. The device of claim 1 wherein said measuring circuit is further configured to communicate with said power supply to adjust said first output voltage to a second output voltage to compensate for a voltage drop between said power supply and said remote load when said switch is in said closed position.

3. The device of claim 1 wherein said measuring circuit further comprises a sense resistor and a second analog to digital (A/D) converter coupled to said power supply, wherein said second A/D converter is configured to measure a voltage across said sense resistor, and wherein, upon a change in said voltage across said sense resistor, said power supply is adjusted to output a second output voltage.

4. The device of claim 3 wherein said second A/D converter includes a proportional-integral-derivative controller configured to provide a control signal to said power supply whereby said power supply outputs said second output voltage.

5. The device of claim 1 wherein said switch is a solid state device.

6. A method for determining a voltage across a remote load, comprising:
  a) providing a power supply configured to output a first output voltage to said remote load;

b) locating a switch between said power supply and said remote load, said switch being selectively movable from a closed position to an open position;

c) providing a measuring circuit comprising a first analog to digital (A/D) converter and a capacitor connected to said remote load and chargeable by said power supply when said switch is in said closed position;

d) supplying said first output voltage to said remote load by said power supply when said switch is in said closed position;

e) measuring said first output voltage;

f) allowing said switch to be moved from said closed position to said open position;

g) supplying a capacitor voltage to said remote load when said switch is in said open position;

h) measuring said capacitor voltage when said switch is in said open position; and i) determining said voltage across said remote load based upon said measured first output voltage and said measured capacitor voltage.

7. The method of claim 6, further comprising the step of:

j) allowing said power supply to adjust said first output voltage to output a second output voltage to compensate for a voltage drop between said power supply and said remote load when said switch is in said closed position.

8. The method of claim 6 wherein said first A/D converter performs step i.

9. The method of claim 6 wherein the measuring circuit further comprises a sense resistor and a second analog to digital (A/D) converter coupled to said power supply, wherein the method further includes:

j) allowing said second A/D converter to detect a voltage change across said sense resistor; and k) allowing a control signal to be sent to said power supply to adjust said power supply to output a second output voltage to compensate for a voltage drop between said power supply and said remote load.

* * * * *